United States Patent [19]
Kuriyama et al.

[11] Patent Number: 5,994,719
[45] Date of Patent: Nov. 30, 1999

[54] SRAM SEMICONDUCTOR DEVICE

[75] Inventors: Hirotada Kuriyama; Masahiro Ishida; Yoshiyuki Ishigaki, all of Hyogo, Japan

[73] Assignee: Mitsubishi Denki Kabushiki Kaisha, Tokyo, Japan

[21] Appl. No.: 09/116,245

[22] Filed: Jul. 16, 1998

Related U.S. Application Data

[63] Continuation of application No. 08/810,786, Mar. 5, 1997, Pat. No. 5,841,153, which is a continuation of application No. 08/693,497, Aug. 7, 1996, Pat. No. 5,619,056, which is a continuation of application No. 08/260,428, Jun. 15, 1994, abandoned.

[30]  Foreign Application Priority Data

Dec. 16, 1993 [JP] Japan ..................... 5-316634

[51] Int. Cl.$^6$ ................................ H01L 29/76
[52] U.S. Cl. .................. 257/69; 257/66; 257/67; 257/72; 257/369; 257/903
[58] Field of Search .................. 257/66, 67, 69, 257/72, 309, 369, 377, 385, 393, 903

[56] References Cited

U.S. PATENT DOCUMENTS 5,296,729 3/1994 Yamanaka et al. .
5,382,807 1/1995 Tsutsumi et al. .
5,572,480 11/1996 Ikeda et al. .
5,841,153 11/1998 Kuriyama et al. ..................... 257/69

FOREIGN PATENT DOCUMENTS 4-136854 5/1992 Japan .

OTHER PUBLICATIONS

Ohkubo et al., 16 Mbit SRAM Cell Technologies for 2.0 V Operation, IEDM, pp. 17.5.1–17.5.4, 1991.

A Split Wordline Cell For 16Mb SRAM Using Polysilicon Sidewall Contacts, Kazuo Itabashi et al., IEDM 91, pp. 477–484.

A 2V–Supply Voltage 16Mb SRAM Cell With Load–Lock–CVD Poly and DCS–WSIX Technologies, A Kawamura et al., 1993 Symposium on VLSI Technology, pp. 67–68.

*Primary Examiner*—Valencia Martin-Wallace
*Attorney, Agent, or Firm*—McDermott, Will & Emery

[57]  ABSTRACT

The present invention provides an improved static random access memory which can be manufactured into values as designed by photolithography. Second direct contract for connecting active region and ground line for first and second memory cells is provided at a boundary between the first memory cell and second memory cell. Second direct contact is divided into a plurality of portions.

3 Claims, 23 Drawing Sheets

FIG. 18A PRIOR ART    FIG. 18B PRIOR ART
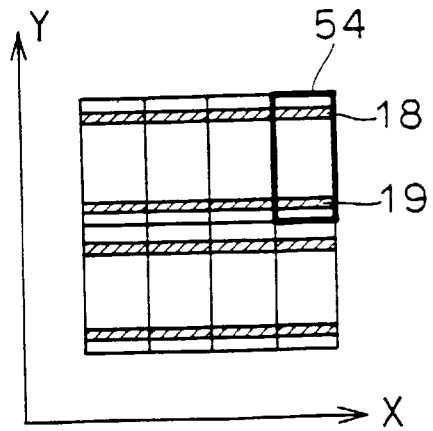
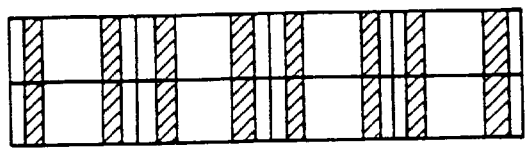
FIG. 19A PRIOR ART
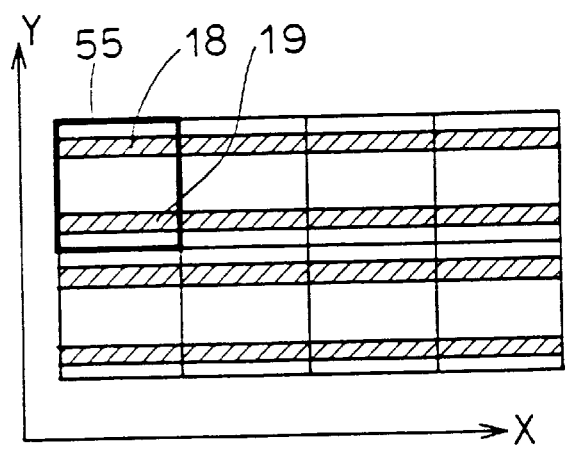
FIG. 19B PRIOR ART
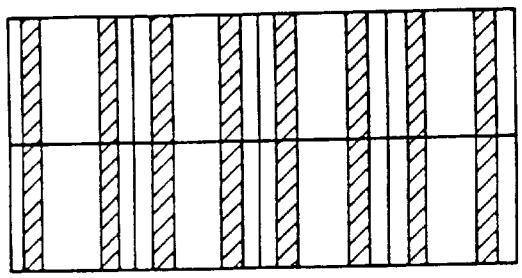

SRAM SEMICONDUCTOR DEVICE

This application is a continuation of application Ser. No. 08/810,786, filed Mar. 5, 1997 U.S. Pat. No. 5,841,153, which is a continuation of application Ser. No. 08/693,497, filed Aug. 7, 1996, now U.S. Pat. No. 5,619, 056, which is a continuation of application Ser. No. 08/260,428, filed Jun. 15, 1994 now abandoned.

BACKGROUND OF THE INVENTION

1. Field of the Invention

The present invention relates generally to semiconductor devices, and more specifically, to a static random access memory (hereinafter referred to as SRAM).

2. Description of the Background Art

FIG. 20 is an equivalent circuit diagram showing an SRAM cell. The SRAM includes six transistors altogether, access transistors 1, 2 and driver transistors 3, 4 formed on a substrate, and load transistors 5, 6 formed of thin film transistors. Access transistor 1 includes a word line 7, and access transistor 2 includes a word line 8. Access transistor 1 is connected to a bit line 9, and access transistor 2 is connected to a $\overline{\text{bit}}$ line 10. In the figure, the portions designated with reference numerals 11, 12 indicate parasitic resistance in a ground line (hereinafter referred to as GND) 43.

The SRAM cell operates as follows.

In reading, voltage is applied to word lines 7, 8 to open the gate. At the time, voltages corresponding to their respective inverter states appear at bit line 9 and $\overline{\text{bit}}$ line 10. In writing, also voltage is applied to word lines 7, 8 to open the gate, and voltage corresponding to a desired state of writing is applied to bit line 9 and $\overline{\text{bit}}$ line 10.

The layout of the equivalent circuit is disclosed in IEDM 91, pp.477–484. FIGS. 21 to 23 show a layout for one conventional SRAM cell. FIG. 22 is drawn on the layout shown in FIG. 21, and the layout shown in FIG. 21 is drawn on the layout shown in FIG. 22. The SRAM includes field oxide films 13, 14, 15, active regions 16, 17, first gates 18, 19, 20, 21 formed of polysilicon or polycide, first direct contacts 22, 23 linking the active regions and the first gates, second gates 24, 25, 26 formed of polysilicon or polycide, and second direct contacts 27, 28, 29, 30 linking the active regions and the second gates.

Referring to FIG. 22, the SRAM includes third gates 31, 32 (to be the gates of TFTS) formed of polysilicon, third direct contacts 33, 34 linking the first gates and the third gates, forth gates 35, 36 (to be the channel/source/drain regions of TFTs) formed of polysilicon, and forth direct contacts 37, 38 linking the third gates and the forth gates.

Referring to FIG. 23, the SRAM includes first metal interconnection layers 39, 40 (bit lines), and contacts 41, 42 linking the second gates and the first interconnection layers.

FIG. 24 is a cross sectional view showing the SRAM in FIGS. 21 to 23 taken along line 24—24.

Referring to FIGS. 20 and 24, access transistor 1 is formed of active region 16 and first gate 18. Access transistor 2 is formed of active region 17 and first gate 19. Driver transistor 3 is formed of active region 17 and first gate 20. A thin film transistor, load transistor 5 is formed of third gate 32, and forth gate (channel/source/drain region) 36. A thin film transistor, load transistor 6 is formed of third gate 31, forth gate (channel/source/drain region) 35. Word line 7 corresponds to first gate 18, and word line 8 corresponds to first gate 19. Bit line 9 corresponds to first metal interconnection layer 39, and bit line 10 corresponds to first interconnection layer 40. The GND lines 43 of the memory cell corresponds to second gate 24. The parasitic resistance 11 of GND corresponds to the resistance of second direct contact 27. The parasitic resistance 12 of GND corresponds to the resistance of second direct contact 28.

Thus structured conventional SRAM is encountered with the following problem.

Referring to FIG. 20, when a reading operation is performed with storage nodes a and b being at Low and High states, respectably column current i is passed from the bit line to GND line 43 through storage node a. At the time, if parasitic resistance 11 is large the Low level of storage node a increases, resulting in destruction of data. Accordingly, in order to keep parasitic resistance 11 small, referring to FIG. 21, second direct contacts 27, 28 are formed in a rectangular form and its area on a plane is set large. In contrast, the second direct contacts 29 and 30 of the bit line portion has a small area on a plane, because the parasitic resistance does not affect the operation.

It was however difficult to form holes of different sizes by photolithography, because with difference in quantities of light, such holes cannot be opened precisely into designed values.

FIG. 25 is a diagram showing two memory cell arrays, designating one memory cell (exclusive of parasitic resistance 11, 12 at GND) as X. A memory cell portion $X_a$ and a memory cell portion $X_b$ are provided adjacent to each other.

Referring to FIG. 25, the parasitic resistance 11, 12 of GND (in other words second direct contacts 27, 28) are shared between cell Xa and adjacent cell Xb. Therefore, in the worst case, column current i for the two cells is passed across parasitic resistance 11, 12, thus increasing the potential on the Low side of storage node and data is likely to be destroyed. Accordingly, second direct contacts 27, 28 must be formed large enough.

Note that "direct contact" herein refers to the one as shown in FIG. 26. Referring to FIG. 26, a connecting portion 102 is connected to portion 100 through a contact hole 101a provided in an interlayer insulating film 101.

For stable memory operation, as described in IEDM 91, pp.481–484 the cell ratio (=driver transistor current/access transistor current) must be large enough. Accordingly, the gate length of a driver transistor is desirably shorter, with its gate width being larger, while the gate length of an access transistor is desired to be long with its gate width being narrow. It is, however, difficult to form two kinds of gates having different gate lengths and gate widths in a memory cell, because they cannot be precisely fabricated into values as designed due to difference in quantities of exposure light in photolithography.

In addition, if the gate width of an access transistor is narrowed, the narrow channel effect occurs, which causing fluctuations of its $V_{th}$ only in the access transistor.

The size of a direct contact is determined based on the limit of exposure in photolithography (a minimum interval between two patterns), and the minimum width of each interconnection (each gate) is usually substantially equal to the length of a shorter side of a direct contact. Accordingly, when each interconnection is linked with a direct contact, the width of the interconnection is thickened at connecting positions taking into account registration margins for masks. Accordingly, excess spaces must be secured at such connecting positions.

Additionally, in a conventional memory cell, referring to FIG. 24, first direct contact 22, third direct contact 33 and forth direct contact 37 are formed upon each other in the vertical direction, and direct contact portion 37 is in a dented form. Therefore, the hole must be formed deep which makes etching difficult and the presence of steps reduces margins for photolithography.

SUMMARY OF THE INVENTION

Is therefore an object of the invention to provide an improved static random access memory with reduced parasitic resistance.

Another object of the invention is to provide an improved static random access memory which can be manufactured based on designed values in photolithography.

A further object of the invention is to provide an improved static random access memory in which only column current for 1 cell is passed across the direct contact of a GND portion.

Yet another object of the invention is to provide an improved static random access memory without a recess being formed in forming a direct contact and permitting etching and photolithography to be readily performed.

A still further object of the invention is to provide an improved static random access memory with an increased cell ratio.

An additional object of the invention is to provide an improved static random access memory in which an excess space is not necessary at a connecting portion of each interconnection and a direct contact.

Another additional object of the invention is to provide an improved static random access memory permitting the architecture of a cell array to be readily changed.

A semiconductor device according to a first aspect of the invention includes a semiconductor substrate. An active region is provided in a main surface of the semiconductor substrate. A first memory cell and a second memory cell adjacent to the first memory cell are provided on the semiconductor substrate. The first and second memory cells include an access transistor and a driver transistor provided on the active region, respectively and a load transistor formed of a thin film transistor provided in the upper part of the semiconductor substrate, respectively. A second direct contact connecting the active region and a ground line for the first and second memory cells is provided at the boundary between the first memory cell and the second memory cell. The second direct contact is divided into a plurality of pieces.

A semiconductor device according to a second aspect of the invention includes a semiconductor substrate, memory cells provided on the semiconductor substrate, and an active region provided for each memory cell. The memory cell includes an access transistor and a driver transistor formed on the active region, and a load transistor formed of a thin film transistor provided in the upper part of the semiconductor substrate. The device further includes a second direct contact for connecting the active region and the ground line for the memory cells. A bit line connected to the active region through a second gate is provided on the semiconductor substrate. The device further includes a second direct contact for connecting the second gate and the active region. The size of the second direct contact for connecting the active region and the ground line for the memory cell is made equal to the size of the second direct contact for connecting the second gate and the active region.

A semiconductor device according to a third aspect invention includes a semiconductor substrate. An active region is provided in a main surface of the semiconductor substrate. An access transistor and a driver transistor are provided on the active region. A load transistor formed of a thin film transistor is provided over the semiconductor substrate. The device includes a first direct contact for connecting the active region and a first gate of the driver transistor, a third direct contact for connecting a third gate of the load transistor and the first gate, and a forth direct contact for connecting a forth gate and the third gate to be source/drain regions for the load transistor. The first direct contact, the third direct contact, and the forth direct contact are arranged in the vertical direction so as not to overlap each other.

A semiconductor device according to a forth aspect of the invention includes a semiconductor substrate. An access transistor and a driver transistor are provided on the semiconductor substrate. A load transistor formed of a thin film transistor is formed over the semiconductor substrate. The gate length and width of a first gate of the access transistor are made equal to the gate length and width of a first gate of the driver transistor, respectively.

A semiconductor device according to a fifth aspect of the invention includes a semiconductor substrate. Memory cells are provided on the semiconductor substrate. An active region is provided in a main surface of the semiconductor substrate. The memory cell includes an access transistor and a driver transistor provided on the active region, and a load transistor formed of a thin film transistor provided over the semiconductor substrate. The device includes a first direct contact for connecting the active region and the first gate of the driver transistor, a second direct contact for connecting the active region and a ground line for the memory cell, and a third direct contact for connecting a third gate of the load transistor and the first gate. The size of the third direct contact is made smaller than the size of the second direct contact.

By the semiconductor device according to the first aspect of the invention, the second direct contact for connecting the active region and the ground line is divided into a plurality of portions. Since the total plane area occupied by the divided portions is large enough, parasitic resistance is reduced. Each of the divided portions can be smaller than a conventional one and can therefore be made into the same size as another second direct contact. Therefore, the second direct contact can be manufactured into designed values by photolithography.

By the semiconductor device according to the second aspect of the invention, since one active region is provided for every memory cell, and the second direct contact for connecting the active region and the ground line of the memory cell is provided in the active region, column current only for one cell is passed across the direct contact at the GND portion.

By the semiconductor device according to the third aspect of the invention, since the first direct contact, the third direct contact, and the forth direct contact are arranged in the vertical direction so as not to overlap each other, no recess is produced in forming these direct contacts, thus making etching and photolithography easier to perform.

By the semiconductor device according to the forth aspect of the invention, since the gate length and width of the first gate of the access transistor are made equal to the gate length and width of the first gate of the driver transistor, respectively, the respective gates can be manufactured precisely into values as designed by photolithography.

By the semiconductor device according to the fifth aspect of the invention, since the size of the third direct contact is made smaller than the second direct contact, no excess space is necessary at a contacting portion between each interconnection and a direct contact.

Although the present invention has been described and illustrated in detail, it is clearly understood that the same is by way of illustration and example only and is not to be taken by way of limitation, the spirit and scope of the present invention being limited only by the terms of the appended claims.

BRIEF DESCRIPTION OF THE DRAWINGS

FIGS. 18A and 18B are views each showing a memory cell array arrangement with conventional memory cells;

FIGS. 19A and 19B are views each showing a memory cell array arrangement with memory cells according to the fifth embodiment;

DESCRIPTION OF THE PREFERRED EMBODIMENTS

Embodiment 1

Figure 1:
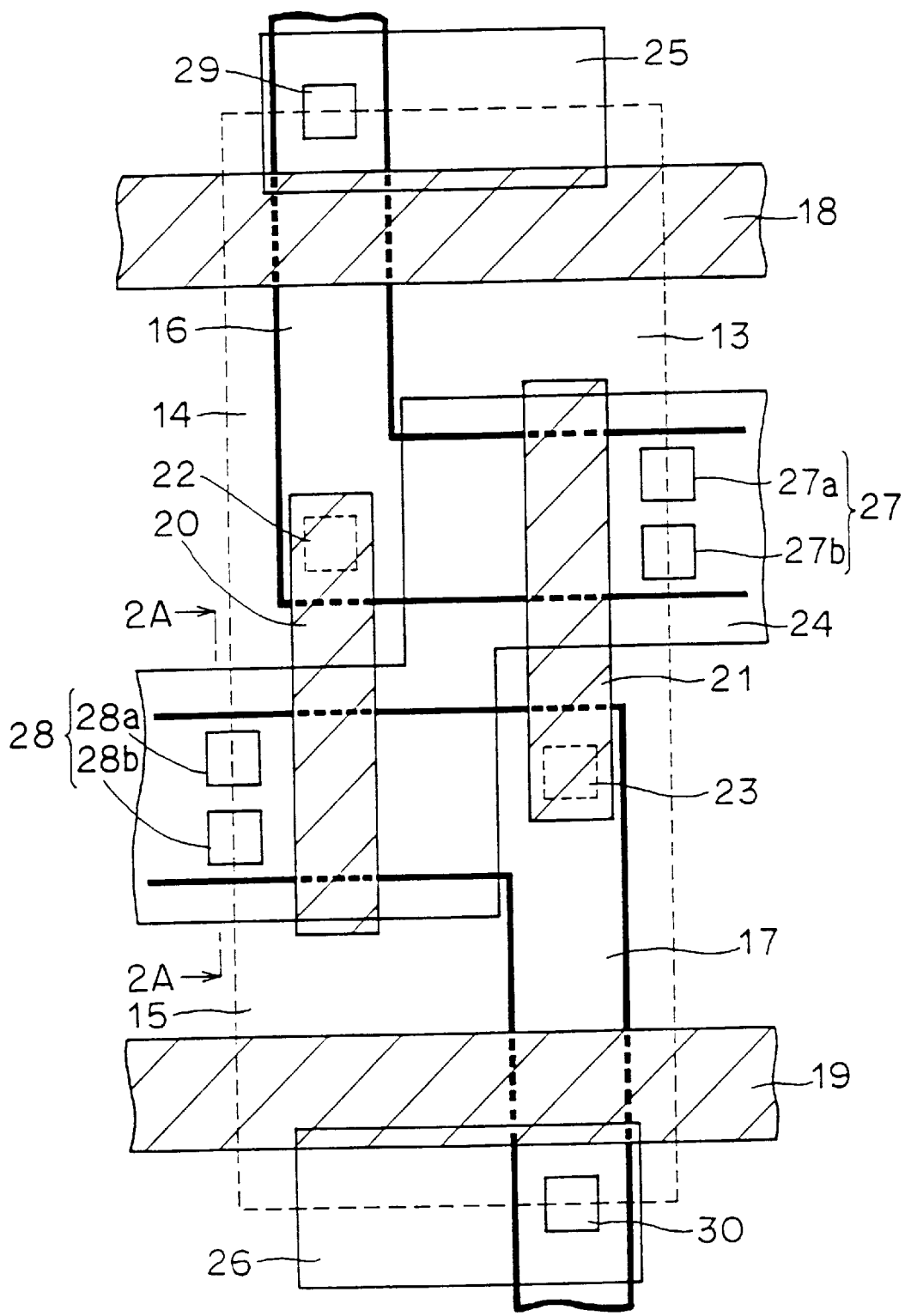
FIG. 1 is a layout of a memory cell according to a first embodiment of the invention.

FIG. 1 is a layout showing an SRAM memory cell according to a first embodiment of the invention. The memory cell layout in FIG. 1 is substantially identical to a conventional example shown in FIG. 19 with the following differences, and therefore like portions are designated with like reference numerals with their description being omitted.

Figure 2A:
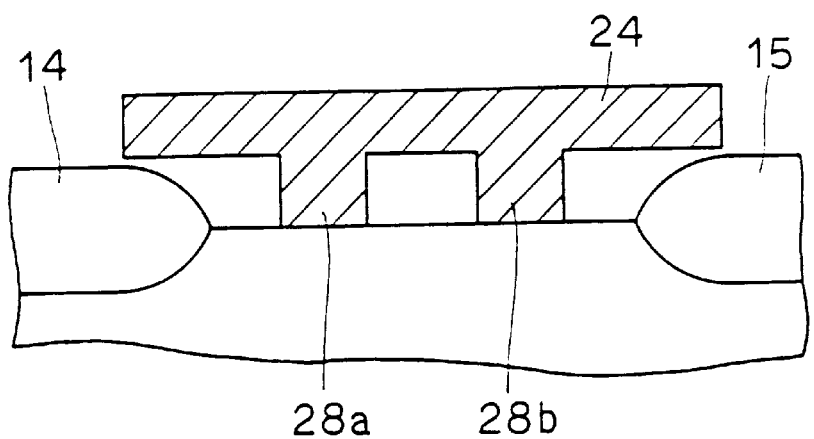
FIG. 2A is a cross sectional view taken along line 2A—2A in FIG. 1.
Figure 2B:
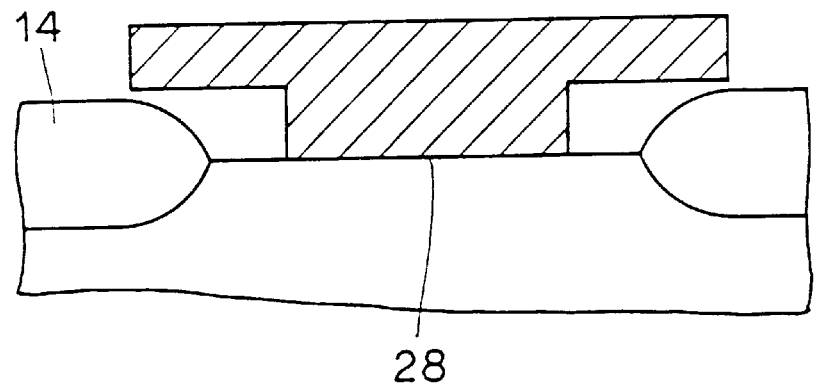
FIG. 2B is a cross sectional view taken long line 2B—2B in FIG. 21 showing a conventional example.

FIG. 2A is a cross sectional view taken along line 2A—2A in FIG. 1. FIG. 2B is a cross sectional view taken along line 2B—2B in FIG. 21 showing a conventional example.

Figure 21:
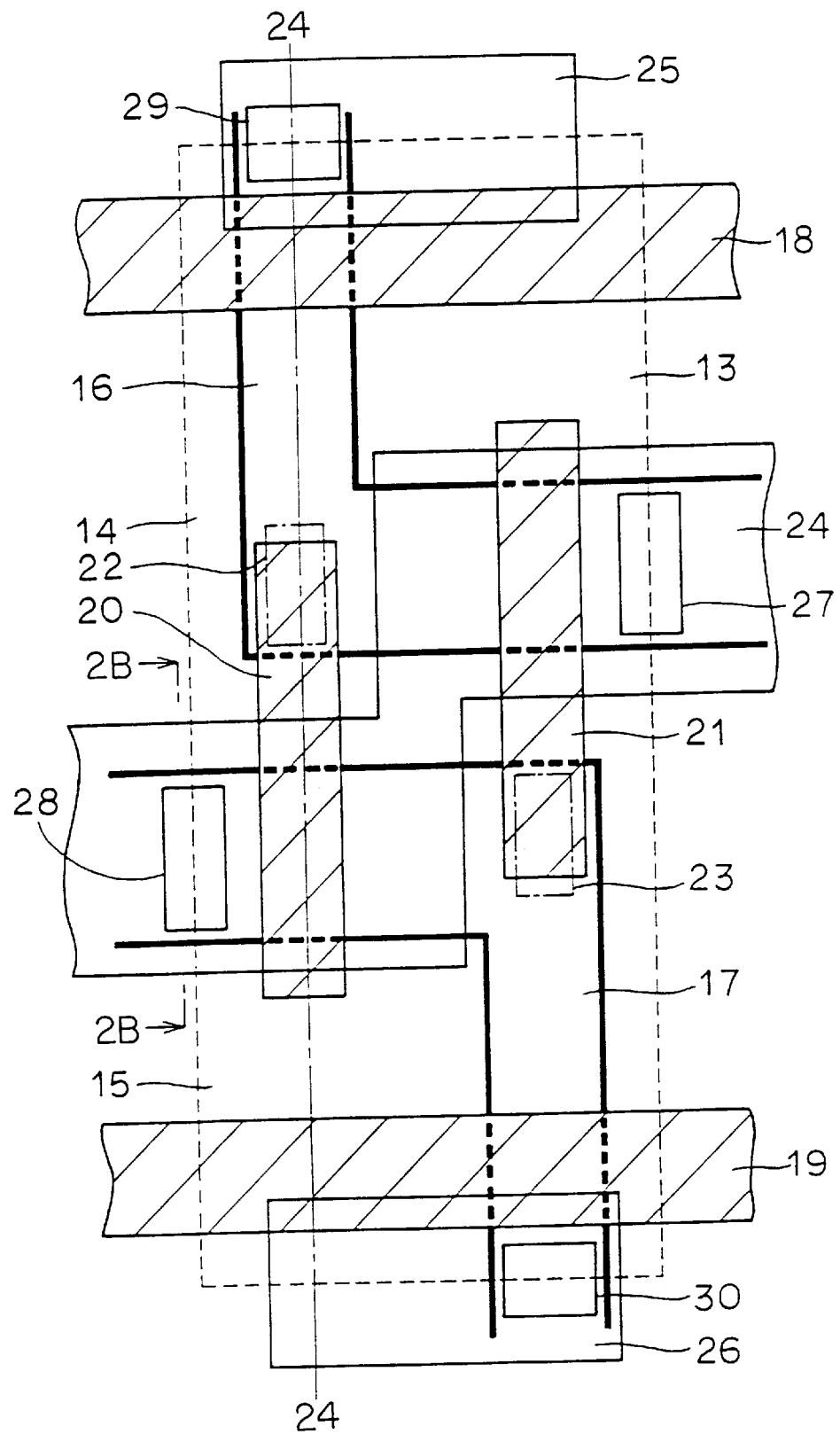
FIG. 21 is a layout showing the first layer of a conventional SRAM memory cell.

The SRAM shown in FIG. 1 is different from the conventional example in FIG. 21 in that direct contacts at the GND portion of a memory cell, in other words second direct contacts 27, 28 are each divided into two (27a, 27b, 28a, 28b). Divided portions 27a, 27b, 28a, and 28bare sized equally to bit line contacts 29 and 30. As they are equally sized, quantities of light at the time of photolithography are equal, thus facilitating the photolithography process. Since a plurality of direct contacts 27a and 27b are provided, the resistance of the direct contact can be reduced as compared to the case of a single small direct contact. The total resistance of direct contacts 27a and 27b are approximately equal to the conventional one in FIG. 21.

More specifically, the area occupied by the direct contacts at the GND portion (27a+27b, 28a+28b) is smaller than the area of conventional rectangular direct contacts (27, 28). Accordingly, there is a possibility that operation is instable as compared to the conventional one due to increased direct contact resistance. If this problem cannot be ignored, the following improvement can be made. The resistance of a direct contact is affected by a native oxide film formed at an interface between a silicon substrate and polysilicon (or amorphous silicon) when the polysilicon or amorphous silicon is deposited. Therefore, unlike a method of forming a conventional polysilicon film (amorphous silicon film), the above-described problem can be solved by reducing the amount of native oxide film to be formed by the use of a load lock type CVD apparatus as disclosed in 1993 SYMPOSIUM ON VLSI TECHNOLOGY OF TECHNICAL PAPERS, PP.67–68.

Figure 3A:
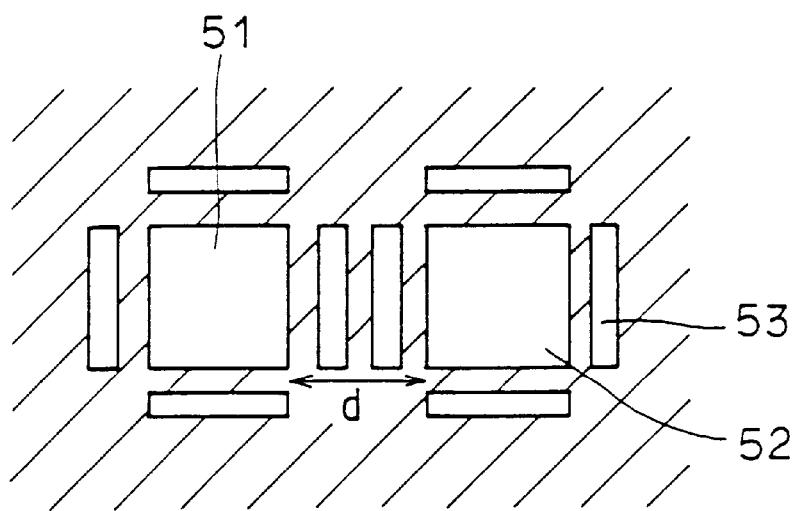
FIG. 3A is a plan view showing a phase shift mask.
Figure 3B:
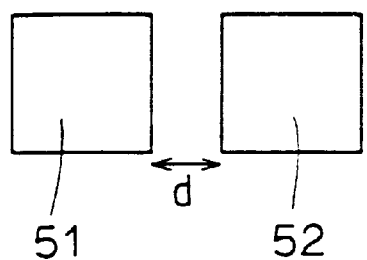
FIG. 3B is a plan view showing a half tone mask.

As illustrated in FIG. 3A, according to a conventional method, the distance (d) between a direct contact 51 and a direct contact 52 is limited by a phase shift mask when such a mask is used. More specifically, since the phase shift mask has an auxiliary pattern 53, the distance (d) between direct contact 51 and direct contact 52 cannot be reduced to be smaller than the size of auxiliary pattern 53. If this problem cannot be ignored, the following improvement can be made. More specifically, use of a half tone mask (see FIG. 3B) as disclosed in Japanese Patent Laying-Open No. 4-136854 can reduce the distance (d) between direct contact 51 and direct contact 52. As a result, direct contacts close to square (27a, 27b) and (28a, 28b) can be placed in the conventional rectangular direct contacts (27, 28).

Embodiment 2

Figure 4:
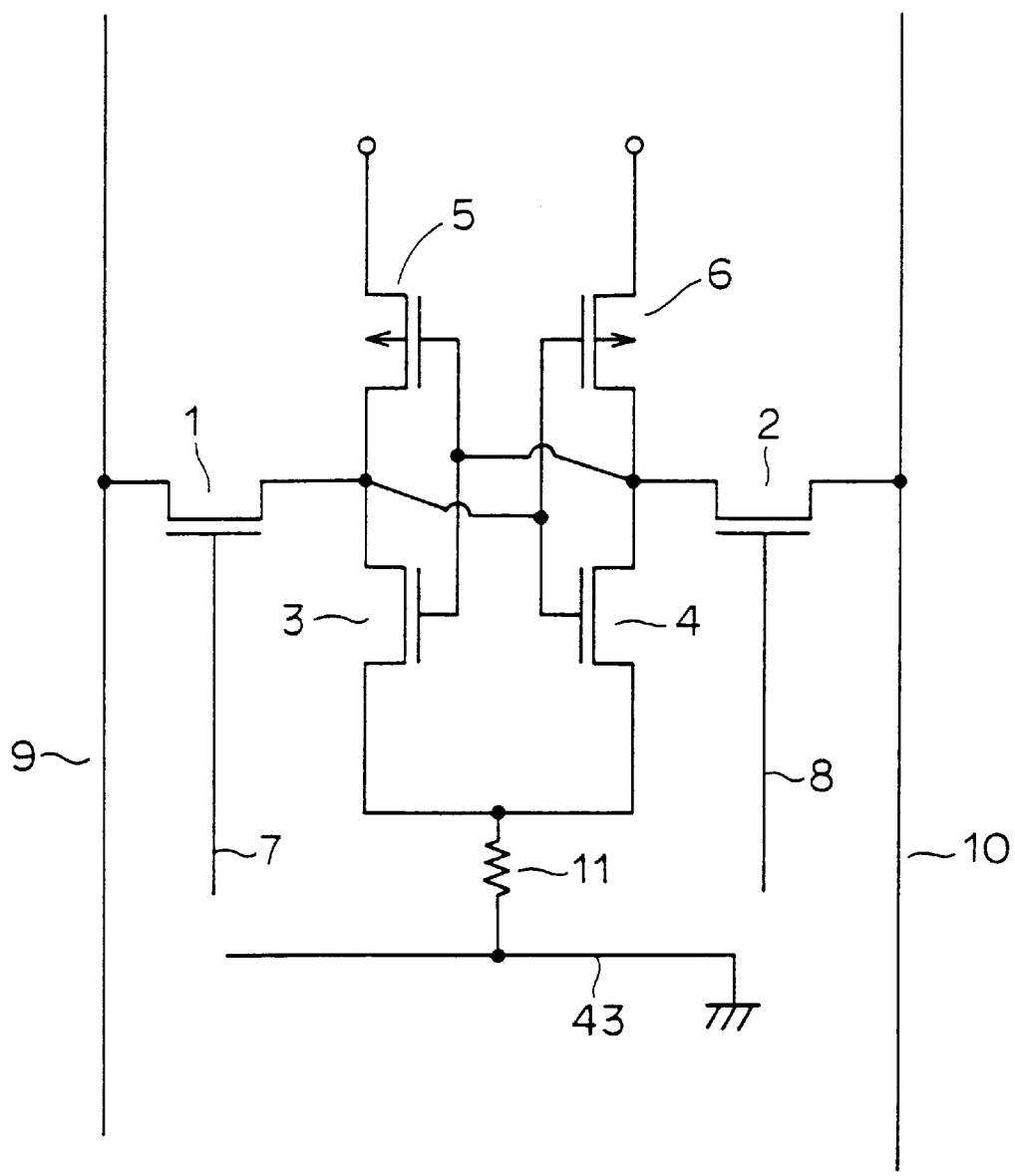
FIG. 4 is an equivalent circuit diagram showing an SRAM memory cell according to a second embodiment of the invention.
Figure 20:
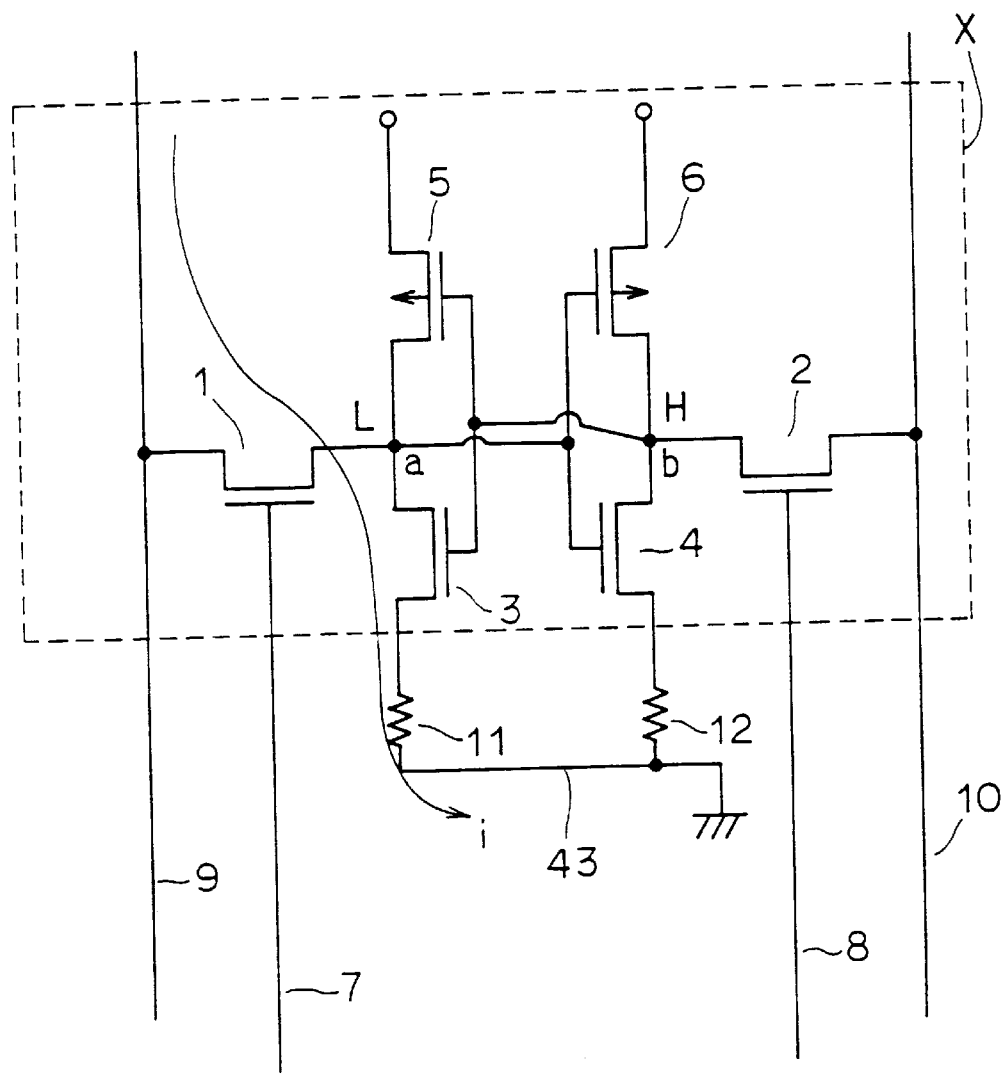
FIG. 20 is an equivalent circuit diagram showing a conventional SRAM memory cell.

FIG. 4 is an equivalent circuit diagram showing a memory cell according to a second embodiment of the invention. The embodiment shown in FIG. 4 is substantially identical to the conventional example in FIG. 20 with the following differences, and therefore the same or corresponding portions are designated with the same reference numerous with their description being omitted. Embodiment 2 is different from the conventional example in that the number of pieces of parasitic resistance (direct contact resistance) 11 of the GND portion is reduced to one.

Figure 5:
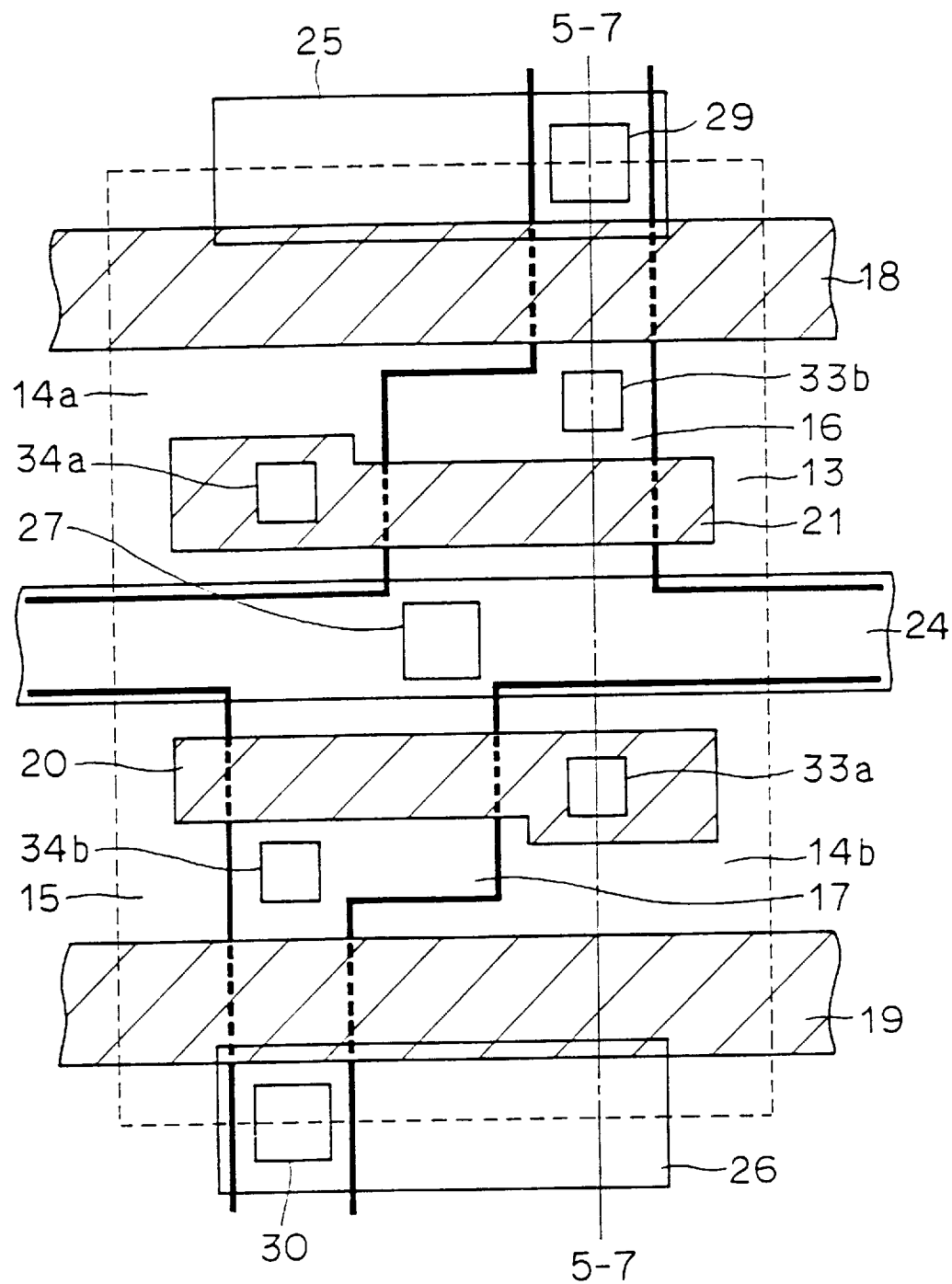
FIG. 5 is a layout showing the SRAM memory cell according to the second embodiment of the invention.
Figure 6:
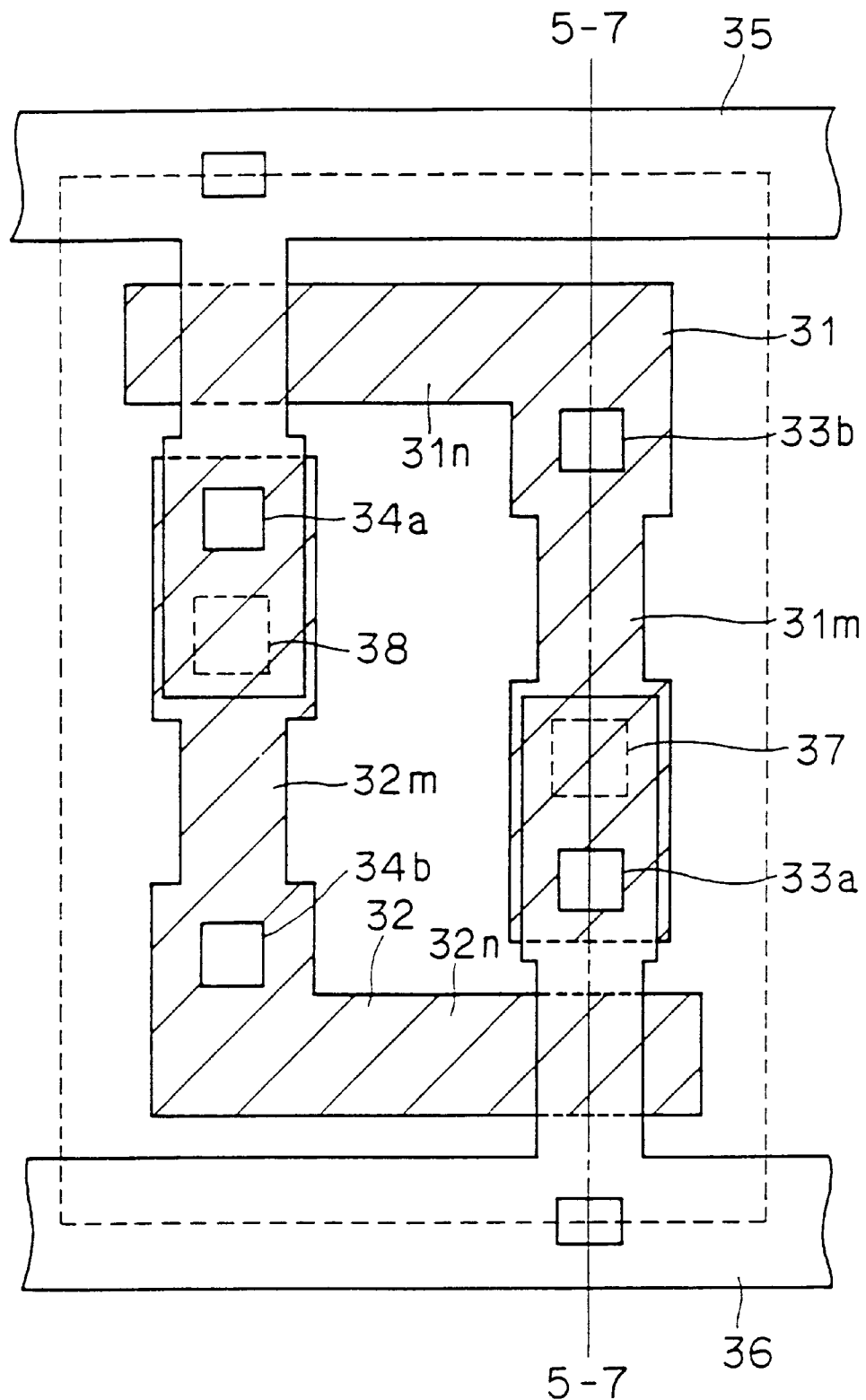
FIG. 6 is a layout showing the second layer of the SRAM memory cell according to the second embodiment of the invention.
Figure 7:
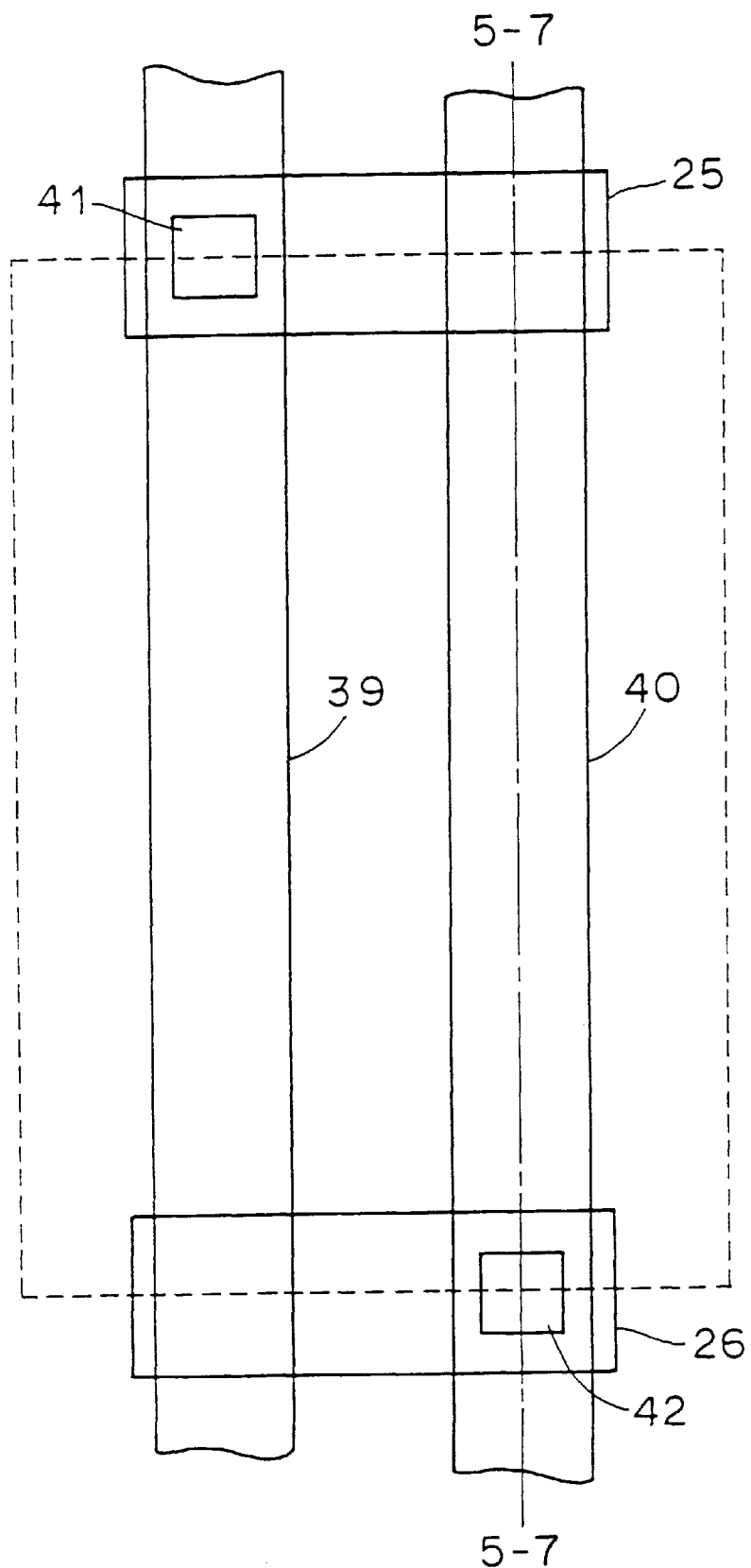
FIG. 7 is a layout showing the third layer of the SRAM memory cell according to the second embodiment of the invention.
Figure 22:
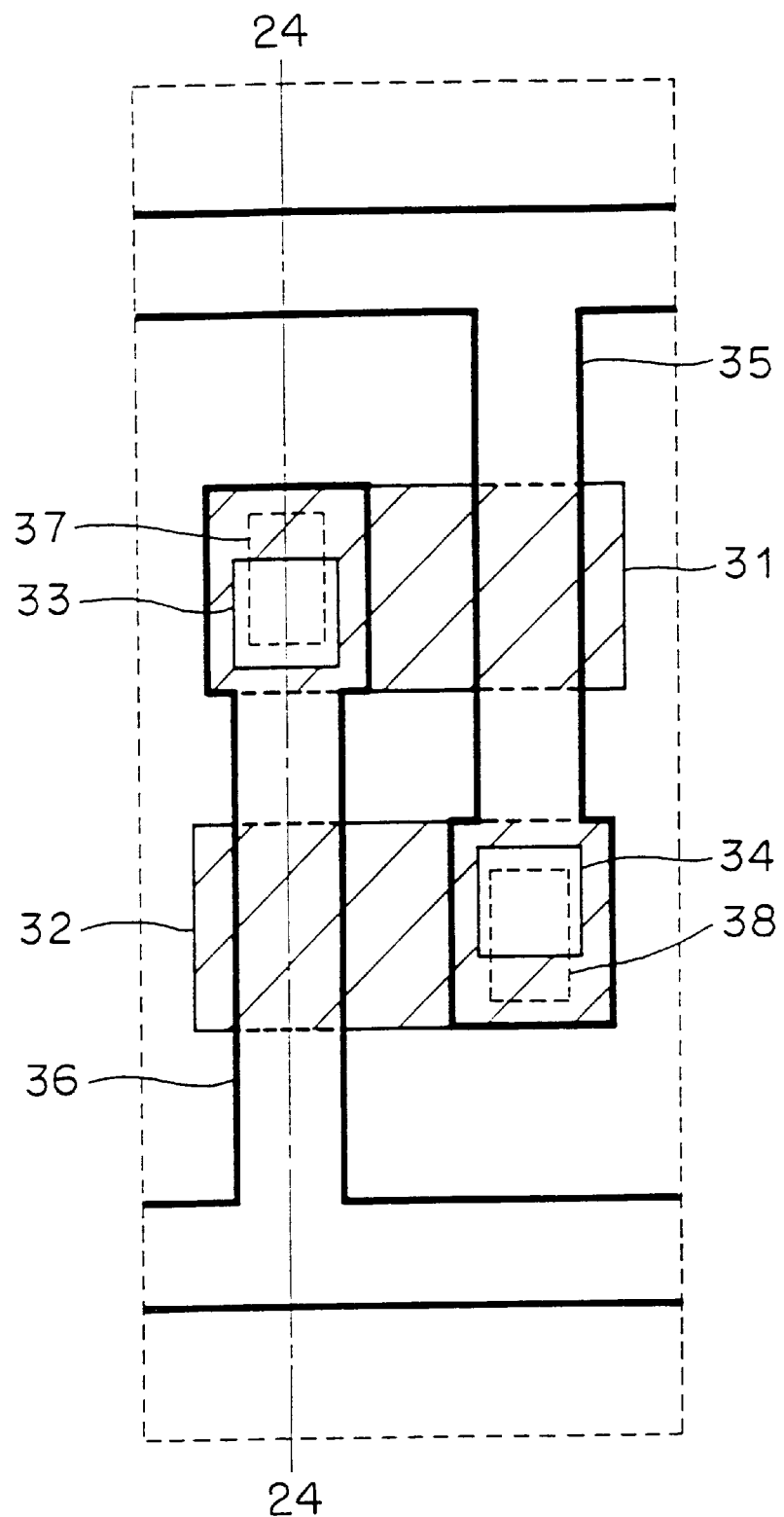
FIG. 22 is a layout showing the second layer of the conventional SRAM memory cell.
Figure 23:
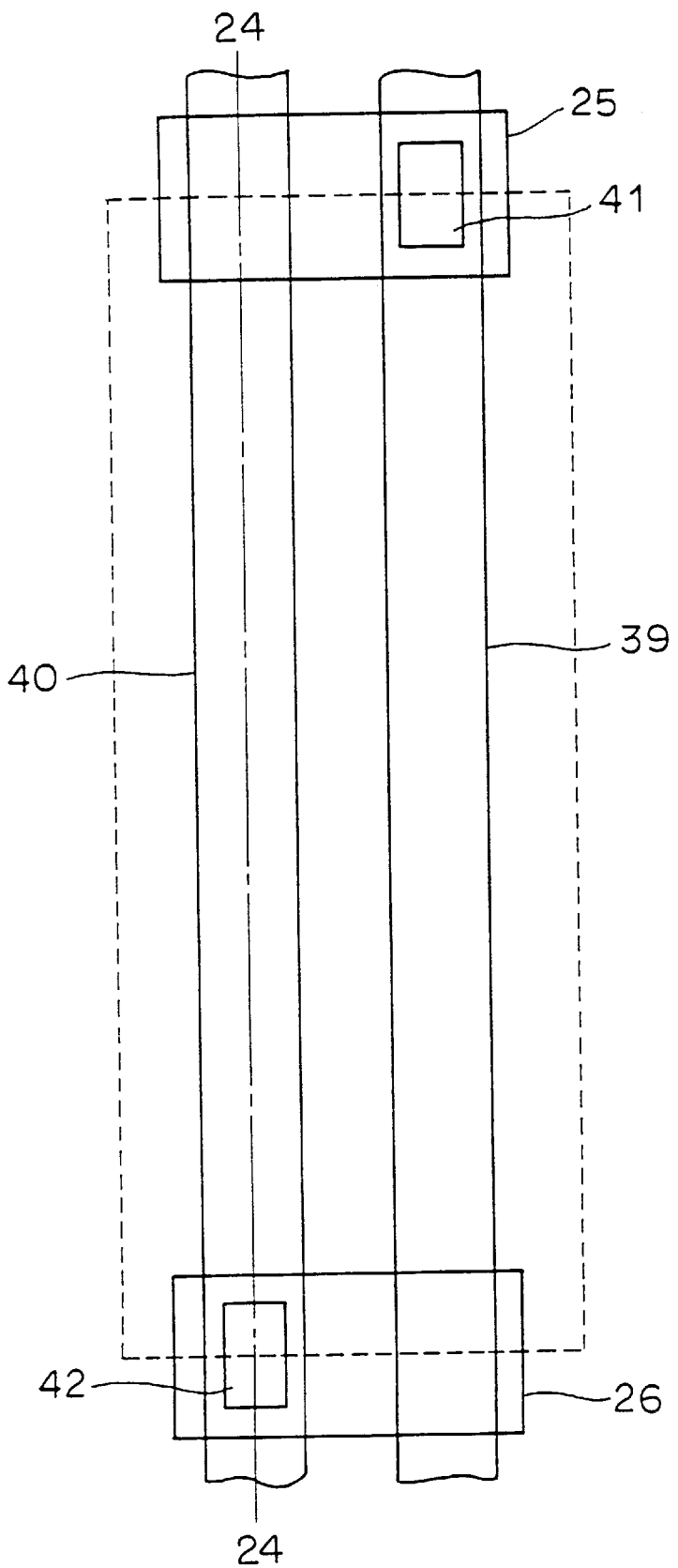
FIG. 23 is a layout showing the third layer of the conventional SRAM memory cell.

FIGS. 5 to 7 are layouts showing a memory cell according to Embodiment 2. A layout in FIG. 6 is placed on a layout in FIG. 5, and a layout in FIG. 7 is placed on a layout in FIG. 6. Hereinafter, differences between Embodiment 2 and the conventional example shown in FIGS. 21 to 23 will be described.

Referring to the FIG. 5, an active region 16 and an active region 17 are linked at the GND portion of a memory cell. A single second direct contact 27 at the GND portion of the memory cell is provided in the center of the memory cell. In the case of the conventional example, referring to FIG. 21, second direct contacts 27 and 28 are provided at the boundary portion of a cell and an adjacent cell. In this embodiment, however, second direct contact 27 is provided in the center of the memory cell.

In the conventional example shown in FIG. 21, first direct contacts 22, 23 connecting the active region and the first gate are present. In contrast, in the present embodiment, there is no such first direct contact. Provided in place of the first direct contact are two kinds of contacts, third direct contacts 33a, 34a connecting a first gate and a second gate, and third direct contacts 33b, 34b connecting the active region and the second gate.

Referring FIG. 6, third gate 31 is formed of one side 31m and another side 31n orthogonal to each other in a flat shape. Third gate 32 is formed of one side 32m and another side 32n orthogonal to each other.

A forth direct contacts 37 connecting the third gate and the forth gate is provided between third direct contact 33a and third direct contact 33b. A forth direct contact 38 connecting the third gate and the forth gate is provided between third direct contact 34a and third direct contact 34b. FIG. 7 is the same as the conventional example shown in FIG. 23.

In this embodiment, referring to FIG. 5, since second direct contact 27 is arranged in the center of the memory cell, column current only for one cell flows. In addition, second direct contact 27 for GND can be sized equal to the second direct contacts 29, 30 of the bit line portion. Accordingly, the problem associated with lithography (fluctuations in size created by different quantities of light) which has been encountered in producing a conventional example as shown in FIG. 21 can be eliminated.

Figure 24:
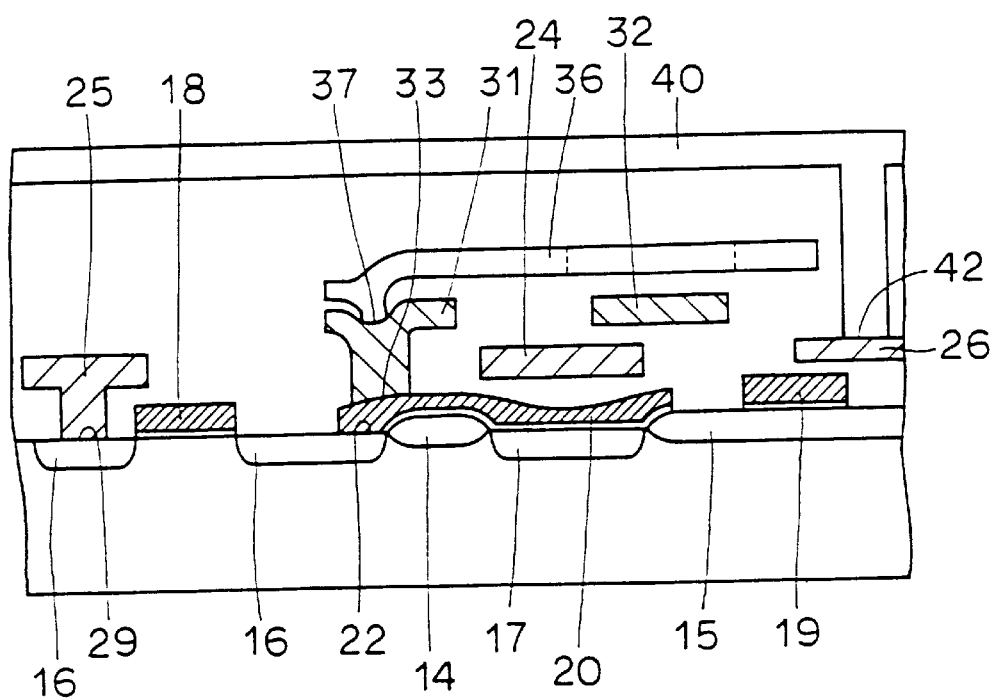
FIG. 24 is a cross sectional view taken along line 24—24 in FIGS. 21 to 23.
Figure 25:
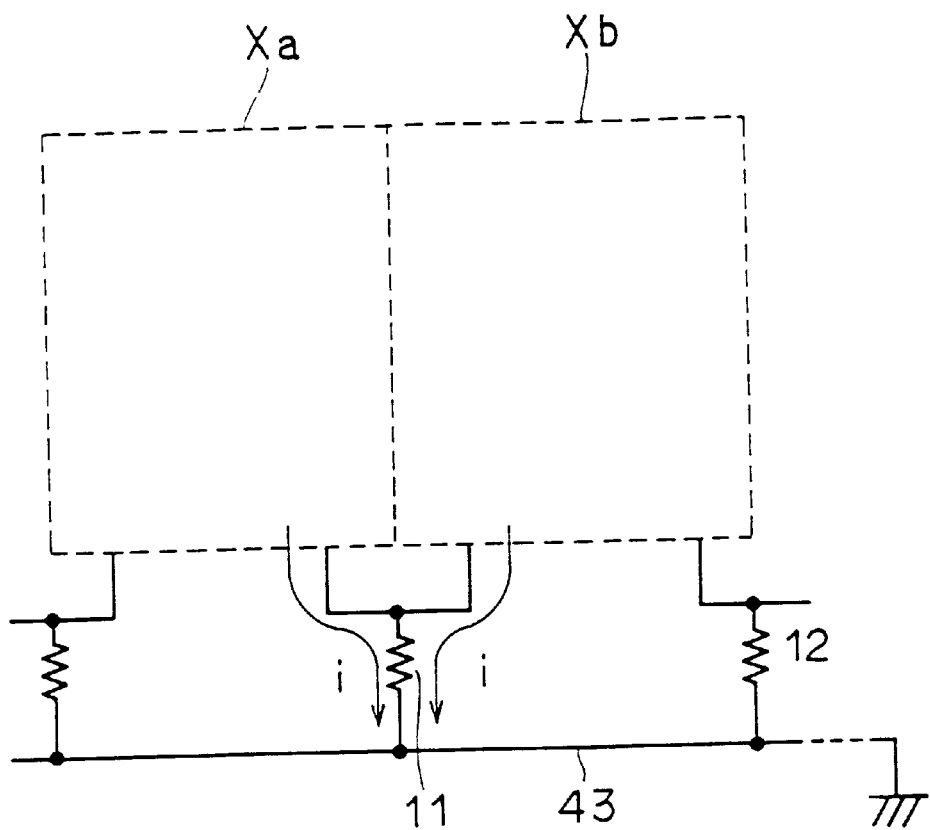
FIG. 25 is a diagram showing a GND portion in two memory cells in the conventional SRAM.
Figure 26:
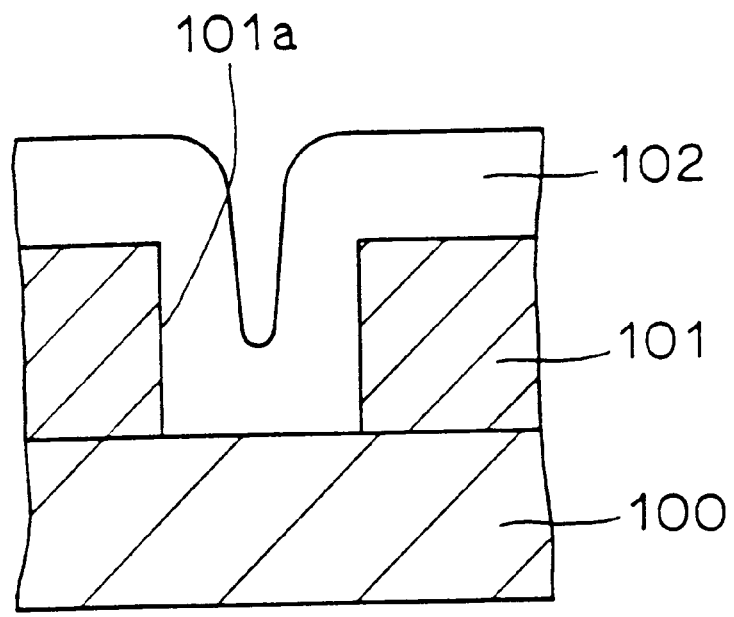
FIG. 26 is a view showing a direct contact employed herein.

Referring to FIG. 6, third gates 31, 32 can be separated into a gate region (31n, 32n) and interconnection region (31m, 32m) for a TFT, and third direct contacts 33a, 33b, 34a, 34b are disposed in the interconnection region (31n, 31m). As a result, the problem of recess created by overlapping direct contact portions (see FIG. 24) can be solved. In addition, since there is no stepped portions, working and photolithography are more easily conducted.

Figure 8:
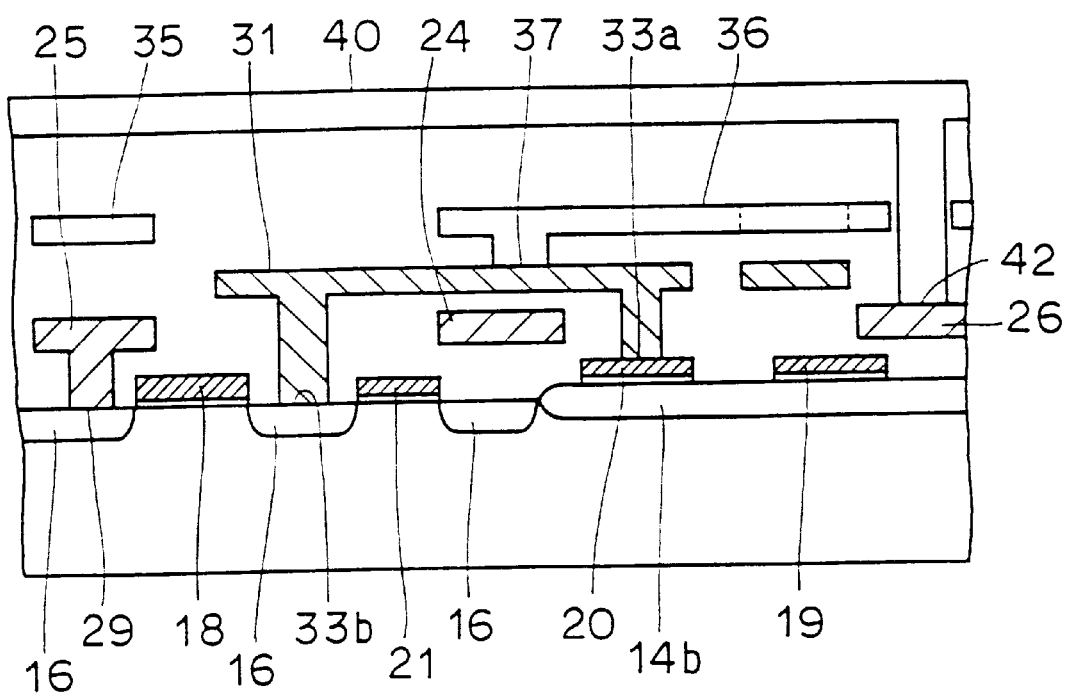
FIG. 8 is a cross sectional view taken along line 5-7—5-7 in FIGS. 5 to 7.

FIG. 8 is a cross sectional view taken along line 5-7—5-7 in FIGS. 5 to 7. Hereinafter, the structure of a semiconductor device will be described by way of manufacturing steps thereof (FIGS. 9 to 13).

Figure 9:
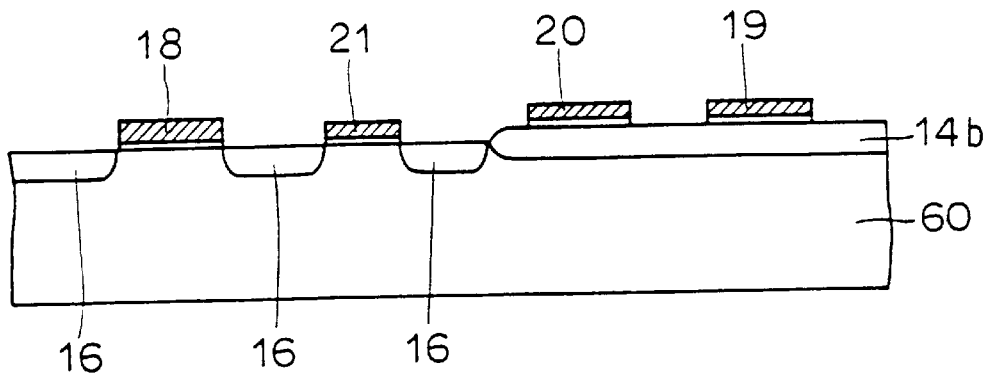
FIGS. 9 to 13 are cross sectional views showing part of a semiconductor device in 1st–5th steps in the order of a method of manufacturing the SRAM in FIG. 8.

Referring to FIG. 9, a field oxide film 14b is formed in a main surface of a semiconductor substrate 60. First gates 18, 19, 20, 21 are formed on semiconductor substrate 60 with an insulating film therebetween.

Figure 10:
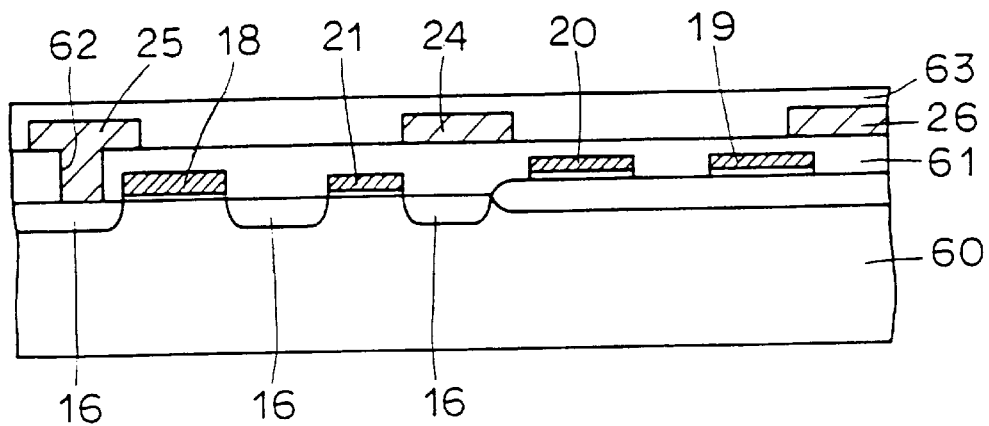

Using first gates 18, 21 as mask, impurity ions are implanted into a surface of semiconductor substrate 60 and an active region 16 is thus formed. Referring to FIG. 10, an interlayer insulating film 61 is formed on semiconductor substrate 60 covering first gates 18, 19, 20, and 21. A contact hole 62 for exposing part of the surface of active region 16 is formed in interlayer insulating film 61. A second gate 25 is formed on semiconductor substrate 60 such that the second gate is connected to active region 16 through contact hole 62. Second gate 24 and 26 are formed at the time of forming second gates 25. An interlayer insulating film 63 is formed on semiconductor substrate 60 so as to cover second gates 24, 25, and 26.

Figure 11:
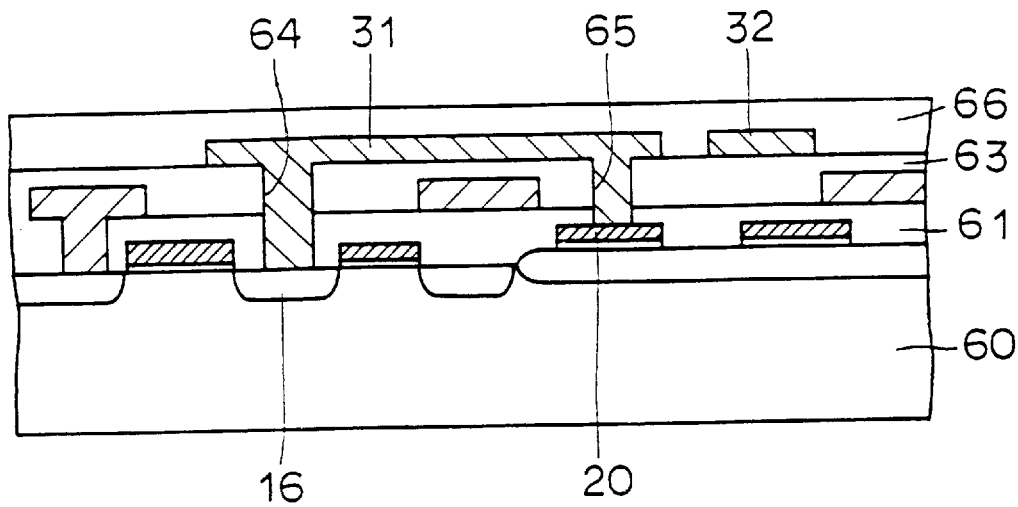

Referring to FIG. 11, a contact hole 64 for exposing part of the surface of active region 16 is formed in and penetrating through interlayer insulating films 61 and 63. A contact hole 65 for exposing part of the surface of the first gate 20 is formed in and penetrating through interlayer insulating films 61 and 63. A third gate 31 connected to active region 16 and first gate 20 through contact holes 64 and 65 is formed on semiconductor substrate 60. At the time, a third gate 32 is formed as well.

An interlayer insulating film 66 is formed on semiconductor substrate 60 so as to cover third gates 31 and 32.

Figure 12:
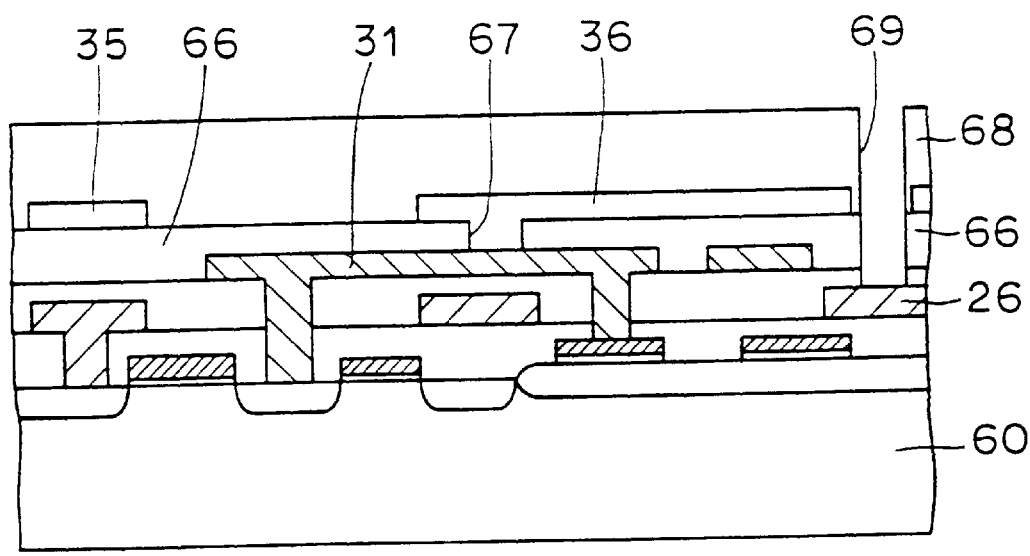
Figure 13:
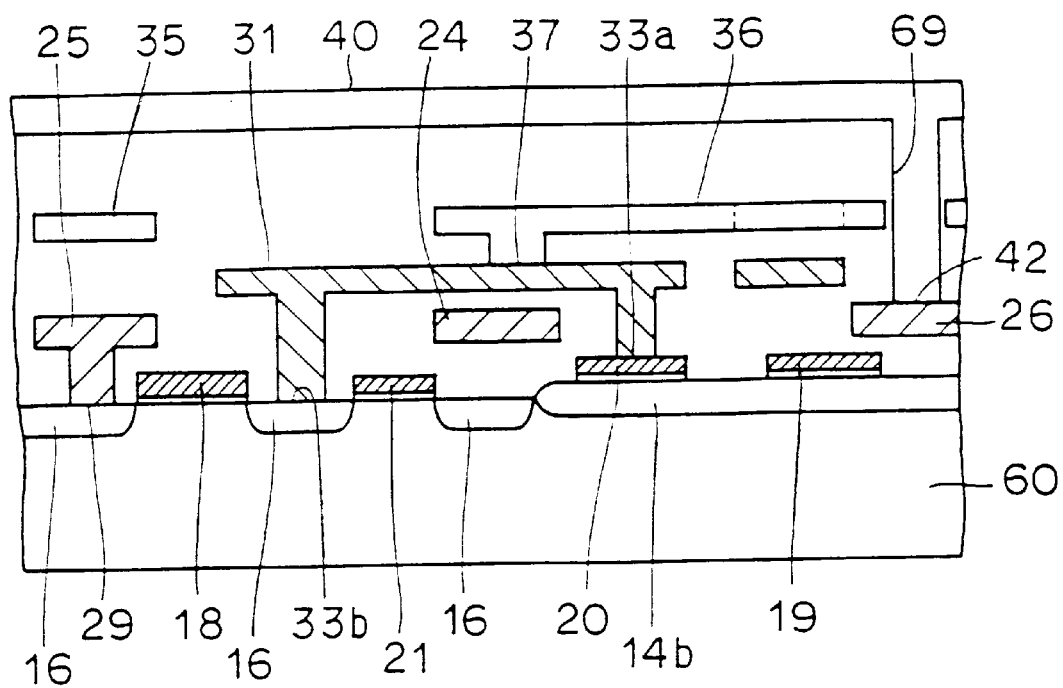

Referring FIG. 12, a contact hole 67 for exposing part of the surface of the third gate 31 is formed in interlayer insulating film 66. A pattern for a forth gate 36 to be connected to third gate 31 though contact hole 67 is formed on semiconductor substrate 60. A pattern for a forth gate 35 is formed at the same time. An interlayer insulating film 68 is formed on semiconductor substrate 60 so as to cover forth gates 35 and 36. A contact hole 69 for exposing part of the surface of second gate 26 is formed in and penetrating through interlayer insulating films 68 and 66. Referring to FIG. 13, a first metal interconnection layer 40 connected to second gate 26 through contact hole 69 is formed on semiconductor substrate 60. By the above-described steps, an SRAM shown in FIG. 8 is completed.

Embodiment 3

Figure 14:
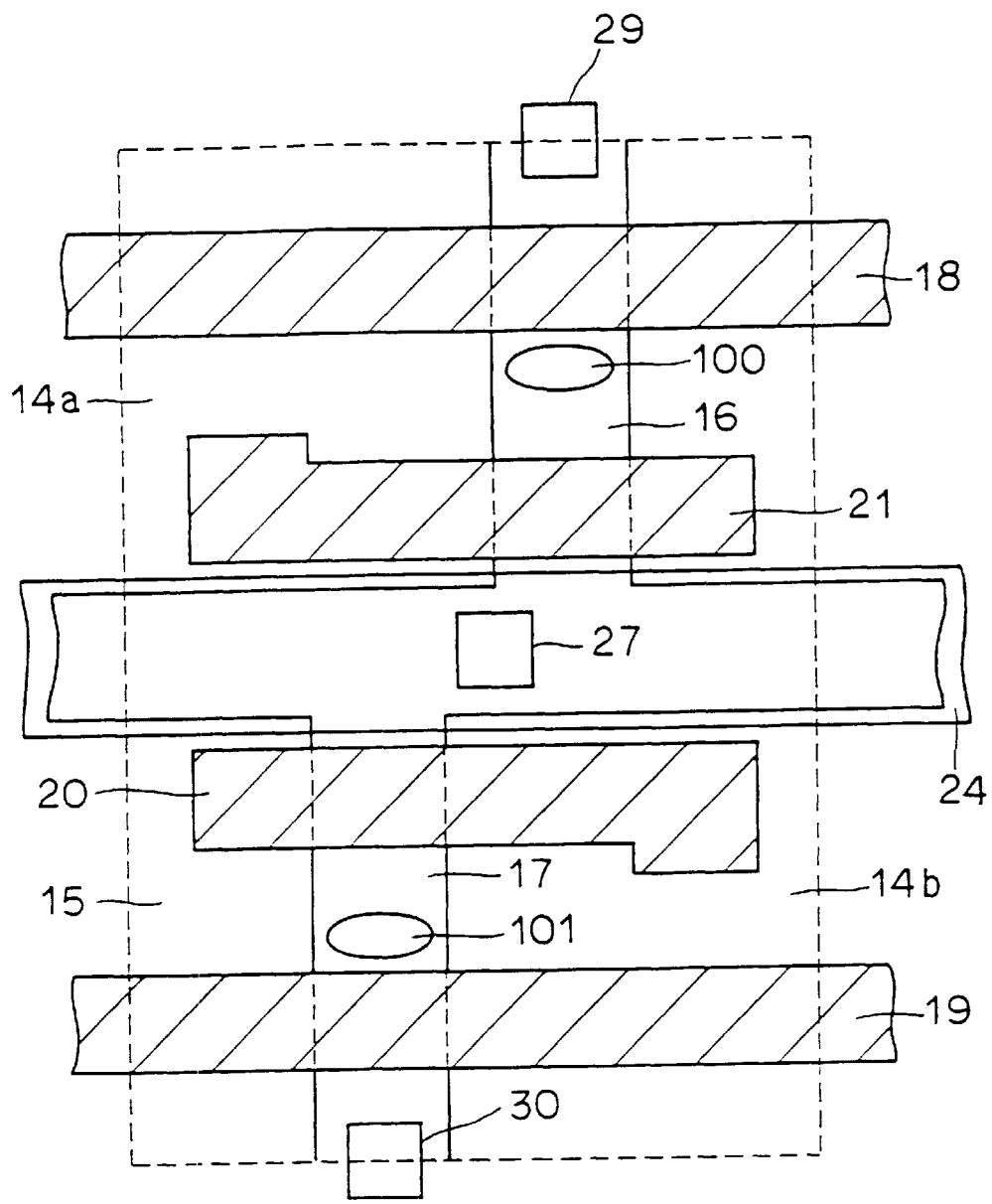
FIG. 14 is a layout showing an SRAM memory cell according to a third embodiment of the invention.

FIG. 14 is a layout showing an SRAM cell according to a third embodiment of the invention. The layout is substantially identical to the layout according to Embodiment 2 with the following differences, and a detailed description of the same portions is omitted here. Though not shown in this embodiment, the same layouts as shown in FIGS. 6 and 7 are provided on the layout shown in FIG. 14. In the embodiment, referring FIG. 14, the gate lengths and gate widths of first gates 18 and 19 of an access transistor are sized equally to the gate lengths and gate widths of first gates 20, 21 of a driver transistor. Accordingly, fluctuations in size at the time of photolithography can be eliminated.

Note that if the amount of impurity implanted in source regions 100, 101 of the access transistor is reduced, source resistance increases, therefore the current of the access transistor is reduced, and the cell ratio can be increased as a result.

If a minimum gate width (at which the narrow channel effect occurs) is not used, current can be reduced by increasing the resistance of the source region. Accordingly, fluctuations in Vth due to the narrow channel effect can be prevented.

Embodiment 4

Figure 15:
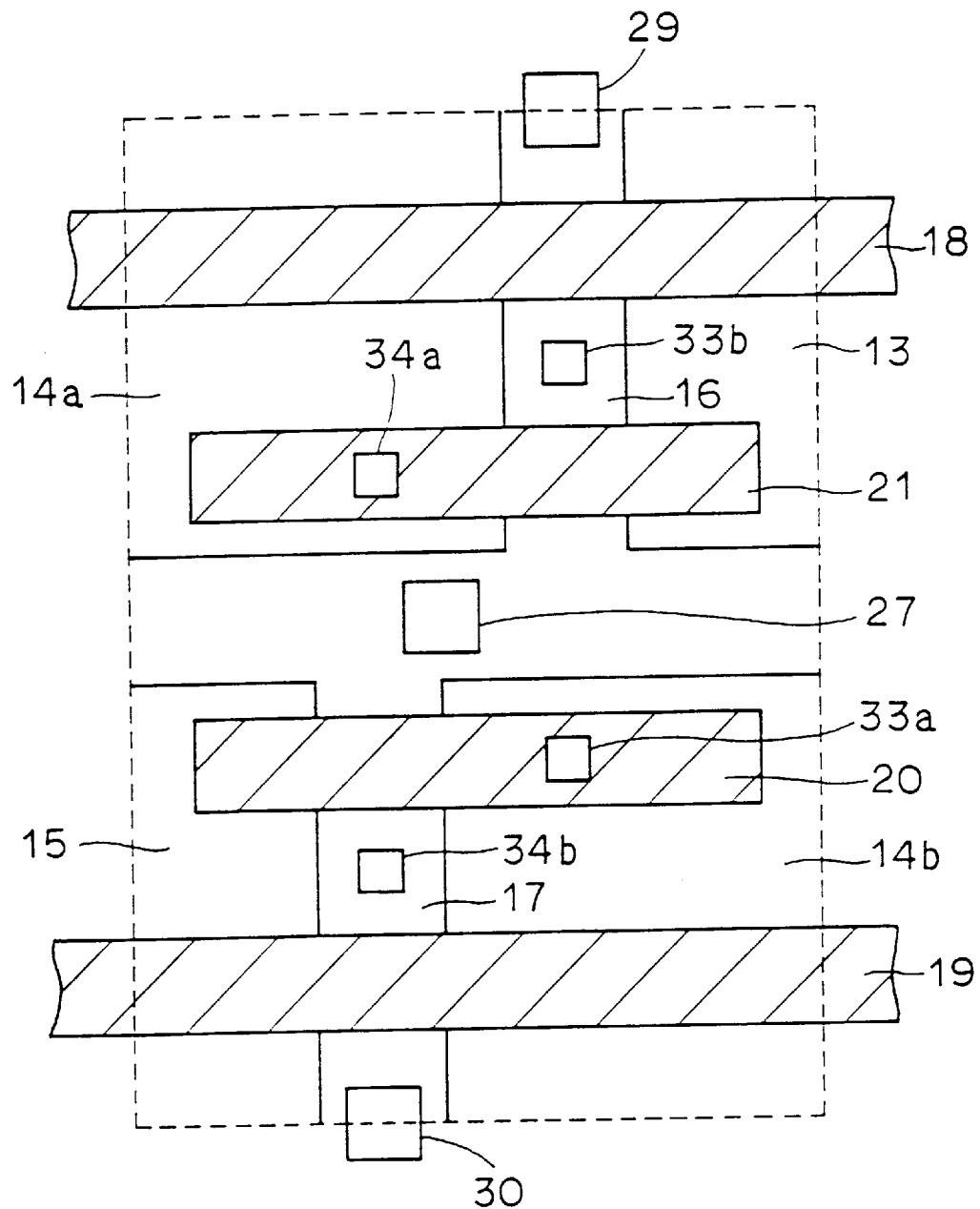
FIG. 15 is a layout showing the first layer of an SRAM memory cell according to a forth embodiment of the invention.
Figure 16:
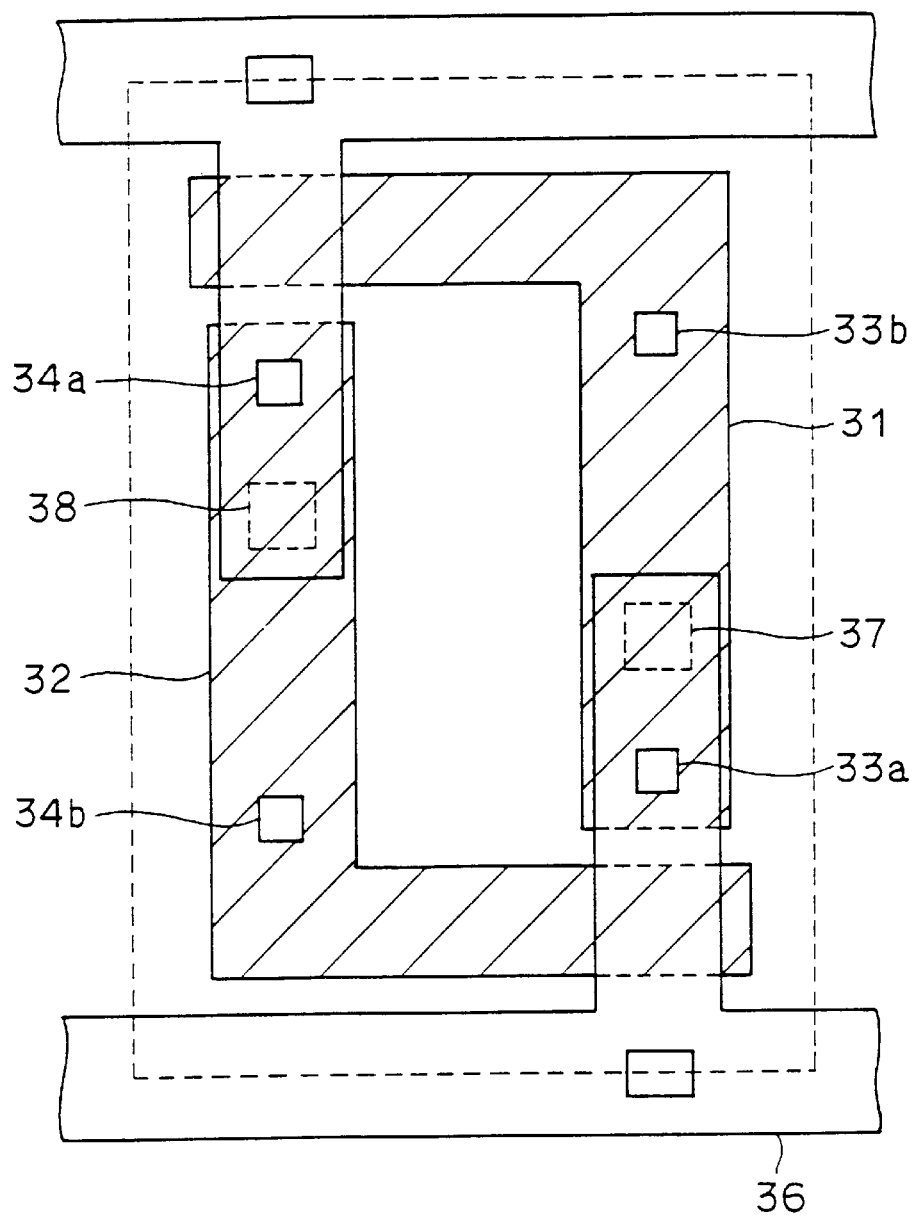
FIG. 16 is a layout showing the second layer of the SRAM memory cell according to the forth embodiment of the invention.

FIGS. 15 and 16 are layouts showing an SRAM memory cell according to Embodiment 4. The layout shown in FIG. 14 is formed on the layout shown in FIG. 15.

Firstly, what is different from the SRAM according to Embodiment 3 is, referring to FIG. 15, that the size of third direct contacts 33a, 33b, 34a, and 34b is reduced. The second different point is that swell of the first gates 20 and 21 of the driver transistor at the connecting portion of the second direct contact is eliminated, and as a result first gate 20, 21 take rectangular form two-dimensionally.

Referring to FIG. 16, forth direct contact 37 and 38 are reduced in size as is third direct contacts 33a, 33b, 34a, and 34b. Thus swell at the connecting portion of third gates 31, 32 and forth gates 35, 36 is eliminated.

A small direct contact is formed as follows.

Figure 17A:
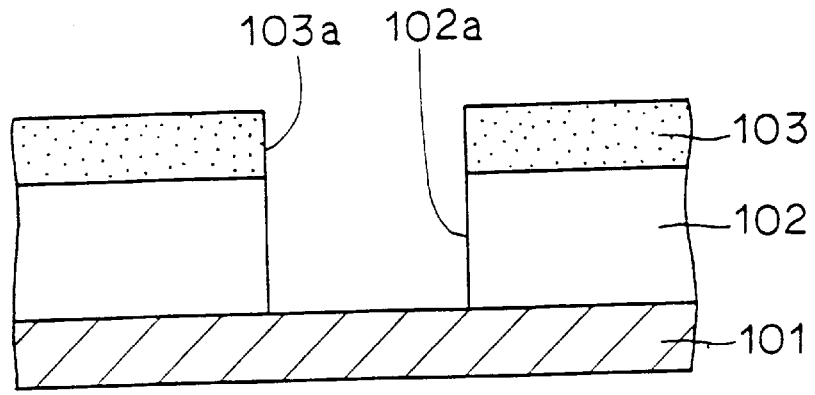
FIGS. 17A, 17B and 17C are cross sectional views each showing part of a semiconductor device in each step in the order of a method of forming a very small direct contact.

Referring to FIG. 17A, an interlayer insulating film 102 is formed on polysilicon or polycide 101. Resist 103 having an opening portion 103a is formed on interlayer insulating film 102. Using resist 103 as mask, interlayer insulating film 102 is etched and a contact hole 102a exposing part of the surface polysilicon or polycide 101 is formed.

Figure 17B:
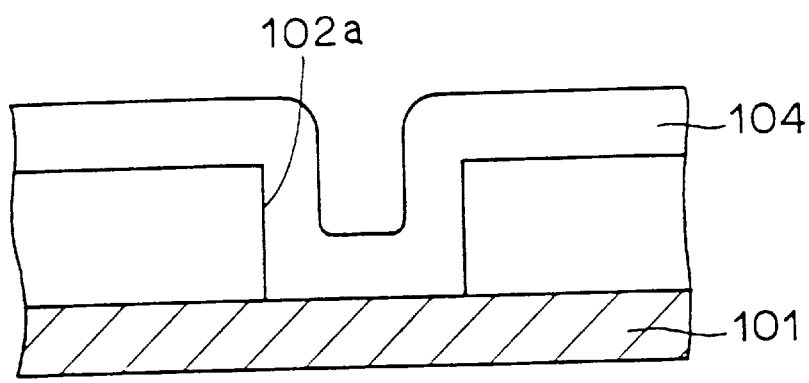

Referring to FIG. 17B, resist 103 is removed away, and an insulating film 104 is formed on polysilicon 101 so as to fill contact hole 102a. The thickness of insulating film 104 varies depending upon the diameter of a desired contact hole.

Figure 17C:
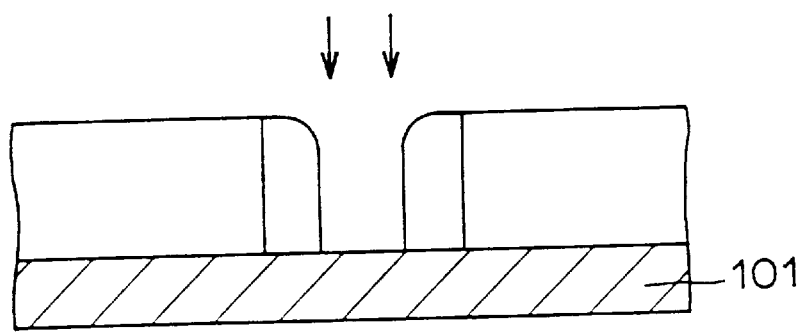

Referring to FIGS. 17B and 17C, insulating film 104 is anisotropically etched to expose part of the surface of polysilicon 101, and thus the diameter of a direct contact can be formed further smaller than an minimum diameter obtained by photolithography techniques.

Current flowing through the second direct contact of this memory cell is smaller than second direct contact 27 for GND. Current the same as the ON current of a TFT (about 1 $\mu$A) flows through the second direct contact, while current in the range from 100 to 300 $\mu$A flows through the GND direct contact. Accordingly, no significant problem is encountered, even if the second direct contact is reduced and direct contact resistance at the portion is increased.

Embodiment 5

This embodiment is a combination of Embodiment 3 and Embodiment 4. Thus combining Embodiment 3 and Embodiment 4 permits the size of a side along the direction in which word lines extend can be equal to the size of a side along the direction in which bit lines extend in a memory cell. More specifically, the form of the memory cell in plane can be made into square.

FIG. 18A shows a example which includes four conventional memory cells 54 (rectangular) in the X direction and two such cells in the Y direction. In the figure, 18 and 19 represent word lines. FIG. 18B shows the case in which memory cells 54 are turned by 90°, and four of them are arranged in the X direction and two of them in the Y direction.

Referring to FIGS. 18A and 18B, if the memory cells are turned by 90°, their sizes both in the X direction and the Y direction will be different from the case without turning them.

In contrast, in the case of memory cells (square) of this embodiment, their sizes will not change as shown in FIGS. 19A and 19B either in the X or Y directions by turning them by 90°. As a result, without changing the number of components in the cell array, the arrangement of the memory cells can freely be changed either in the X direction or in the Y direction, and therefore the architecture can be advantageously readily changed.

As in the foregoing, by the semiconductor device according to the first embodiment of the invention, the second direct contacts are divided into a plurality portions. Accordingly, the total area of the divided portions on a plane is large enough, and parasitic resistance is reduced. Each of the divided portions can be reduced as compared to a conventional one and can be the same in size as another second direct contact. Thus, the second direct contacts can be formed precisely into values as designed by photolithography.

By the semiconductor device according to the second aspect of the invention, an active region is provided for each memory cell, a second direct contact connecting the active region and the ground line of the memory cell is provided in the active region, and therefore current only for one cell flows through the direct contact at GND portion. As a result, an SRAM less likely to have data destruction can be obtained.

By the semiconductor device according to the third aspect of the invention, since the first direct contact, the third direct contact and the forth direct contact are arranged so as no to overlap each other in the vertical direction, no recess is produced at the time of forming these direct contacts, thus facilitating etching and photolithography processes.

By the semiconductor device according to the forth embodiment of the invention, since the gate length and width of the first gate of the access transistor are sized equally to the gate length and width of the first gate of the driver transistor, respectively, these gates can be produced as designed in size.

By the semiconductor device according to the fifth aspect of the invention, since the size of a third direct contact is set to be smaller than the size of a second direct contact, no excess space is necessary at a contacting portion between each interconnection and a direct contact. As a result, an SRAM permitting a high integration density can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A SRAM memory cell having a load transistor formed of a thin film transistor (TFT) comprising:

a polysilicon layer being divided into a TFT gate electrode portion and a connecting interconnection portion; wherein said connecting interconnection portion comprises a first contact portion being in contact with a gate electrode of a driver transistor, a second contact portion being in contact with an active layer and a third contact portion being in contact with a drain region of said thin film transistor, and said second contact portion and said TFT gate electrode portion are not superimposed on each other.

2. A SRAM memory cell as recited in claim 1, wherein said connecting interconnection portion and said TFT gate electrode portion are at right angles to each other.

3. A SRAM memory cell as recited in claim 1, wherein said active layer is formed in a main surface of a semiconductor substrate, said electrode of said driver transistor is provided on a field oxide film formed in the main surface of the semiconductor substrate, and said drain region is provided on said connection interconnection portion.

\* \* \* \* \*